(12) United States Patent
Chang

(10) Patent No.: US 7,659,552 B2
(45) Date of Patent: Feb. 9, 2010

(54) OPTICAL LENS AND LIGHT EMITTING DEVICE USING THE SAME

(75) Inventor: Shao-Han Chang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 365 days.

(21) Appl. No.: 11/697,304

(22) Filed: Apr. 6, 2007

(65) Prior Publication Data

US 2008/0074886 A1   Mar. 27, 2008

(30) Foreign Application Priority Data

Sep. 22, 2006   (CN) .................... 2006 1 0200892

(51) Int. Cl.
*G02B 3/081* (2006.01)
(52) U.S. Cl. .......... 257/98; 257/99; 257/100; 257/E33.073; 362/308; 362/309; 362/310; 362/336; 362/337; 362/338
(58) Field of Classification Search ........... 257/98–100; 362/217, 308–310, 327, 332, 336–338, 340, 362/347, 555, 800
See application file for complete search history.

(56) References Cited

U.S. PATENT DOCUMENTS

| 6,679,621 | B2 * | 1/2004 | West et al. | 362/327 |
| 7,438,445 | B2 * | 10/2008 | Shiau et al. | 362/333 |
| 7,540,635 | B2 * | 6/2009 | Kim et al. | 362/327 |
| 2002/0163810 | A1 | 11/2002 | West et al. | |
| 2003/0235050 | A1 | 12/2003 | West et al. | |
| 2005/0024746 | A1 | 2/2005 | Shimura | |

FOREIGN PATENT DOCUMENTS

CN   1576898 A   2/2005

* cited by examiner

*Primary Examiner*—Ahmed Sefer
(74) *Attorney, Agent, or Firm*—Frank R. Niranjan

(57) ABSTRACT

An exemplary optical lens (300) includes a top surface (301), a base portion (304) opposite to the top surface, and a peripheral side surface defining a first refractive portion (302). The top surface is a generally funnel-shaped top surface. The first refractive portion is corrugated with a plurality of protruding ridge structures, and each of the ridge structures includes a refractive surface (3021). An exemplary light emitting device incorporating the optical lens is also provided.

5 Claims, 10 Drawing Sheets

OPTICAL LENS AND LIGHT EMITTING DEVICE USING THE SAME

BACKGROUND OF THE INVENTION

1. Field of the Invention

The present invention generally relates to optical lenses for light emitting devices and, particularly, to an optical lens typically used for a side emitting light-emitting diode (LED).

2. Discussion of the Related Art

Nowadays, LEDs are widely applied in electronic display devices and illuminating devices. This is because LEDs typically offer the advantages of high illuminating efficiency and a long working lifetime. An LED generally includes a semiconductor chip for emitting light. LEDs can be classified into two kinds according to the location of the semiconductor chip therein: bottom emitting LEDs, and side emitting LEDs.

Referring to FIG. 1, in a typical bottom emitting LED, a semiconductor chip 11 is disposed below a display screen 12. The semiconductor chip 11 is configured for emitting plural kinds of light colors, for example, red, green, and blue (RGB). A distance D1 between the semiconductor chip 11 and the display screen 12 must be large enough to provide a predetermined threshold angle for the RGB lights emitting from the semiconductor chip 11. Thereby, the emitting RGB lights can be adequately mixed and yield white light that illuminates the display screen 12. The distance D1 is apt to increase a thickness of the bottom emitting LED, thereby increasing the overall size of the bottom emitting LED.

Referring to FIG. 2, in a typical side emitting LED, a display screen 22 is stacked on a light guide plate 24, and a semiconductor chip 21 is disposed on at one side of the combined display screen 22 and light guide plate 24. Light emitted from the semiconductor chip 21 travels along light paths including light paths 23 (only one shown). The light paths 23 are located within the light guide plate 24, so that the light can be reflected time after time until the light exits a top of the light guide plate 24 and thus illuminates the display screen 22. Therefore the side emitting LED can provide improved uniformity of light that illuminates the display screen 22. However, an amount of light energy may be lost upon each reflection, and thus the side emitting LED has a limited efficiency of utilization of light. In addition, in the case of a large size display screen 22, some areas of the display screen 22 may not be sufficiently illuminated.

Referring to FIG. 3, this shows an optical lens 31 that is used in another kind of typical bottom emitting LED. The optical lens 31 is configured to improve the efficiency of utilization of light. The optical lens 31 includes a base portion 32, a top reflecting surface 34, a peripheral first refracting surface 36 obliquely angled with respect to a central axis 35 of the optical lens 31, and a peripheral, curved second refracting surface 38 extending from a bottom of the base portion 32 to the first refracting surface 36. The base portion 32 defines a bottom cavity (not labeled) therein. A bottom surface of the base portion 32 is shaped like a flat-topped dome. A semiconductor chip (not shown) can be disposed in or below the bottom cavity. Typically, the semiconductor chip emits light from a point "F" as shown. Light entering the optical lens 31 through a central flat portion of the bottom surface of the base portion 32 in the cavity propagates to the reflecting surface 34. The light is reflected by the reflecting surface 34 to the first refracting surface 36. The light is refracted by the first refracting surface 36, and exits the optical lens 31 in a direction substantially perpendicular to the central axis 35. Light entering the optical lens 31 through a peripheral curved portion of the bottom surface of the base portion 32 in the cavity propagates to the second refracting surface 38. The light is refracted by the second refracting surface 38, and exits the optical lens 31 in a direction substantially perpendicular to the central axis 35.

The optical lens 31 may be employed in side light-emitting devices, so that the side light-emitting devices may be advantageously used with light guides and reflectors that have very thin profiles and/or large illuminated areas. However, each of the first refracting surface 36 and the second refracting surface 38 is a single smooth peripheral surface. Thus it is difficult to manufacture the optical lens 31 to have desired light distribution characteristics and optimum light emitting angles. In addition, if the light incidence angle at the central flat portion of the bottom surface of the base portion 32 is not within a predetermined range, the light may escape from the optical lens 31 through the reflecting surface 34 instead of being reflected to the first refracting surface 36. When this happens, the efficiency of utilization of light is reduced.

Therefore an optical lens which can overcome the above-described shortcomings is desired. A light emitting device employing the optical lens is also desired.

SUMMARY

In one embodiment, an optical lens includes a top surface, a base portion opposite to the top surface, and a peripheral side surface defining a first refractive portion. The top surface is a generally funnel-shaped top surface. The first refractive portion is corrugated with a plurality of protruding ridge structures, and each of the ridge structures includes a first refractive surface.

In another embodiment, a light emitting device includes a light emitting diode chip, and an optical lens coupled to light emitting diode chip. The optical lens includes a top surface, a base portion opposite to the top surface, and a peripheral side surface defining a first refractive portion. The top surface is a funnel-shaped. The first refractive portion is a corrugated refractive portion is corrugated with a plurality of protruding ridge structures, and each of the ridge structures includes a refractive surface.

Other novel features and advantages will become more apparent from the following detailed description when taken in conjunction with the accompanying drawings.

BRIEF DESCRIPTION OF THE DRAWINGS

The components in the drawings are not necessarily drawn to scale, the emphasis instead being placed upon clearly illustrating the principles of the present optical lens and light emitting device. Moreover, in the drawings, like reference numerals designate corresponding parts throughout the several views, and all the views are schematic.

DETAILED DESCRIPTION OF THE EMBODIMENTS

Reference will now be made to the drawings to describe preferred embodiments of the present optical lens and the light emitting device, in detail.

Figure 1:
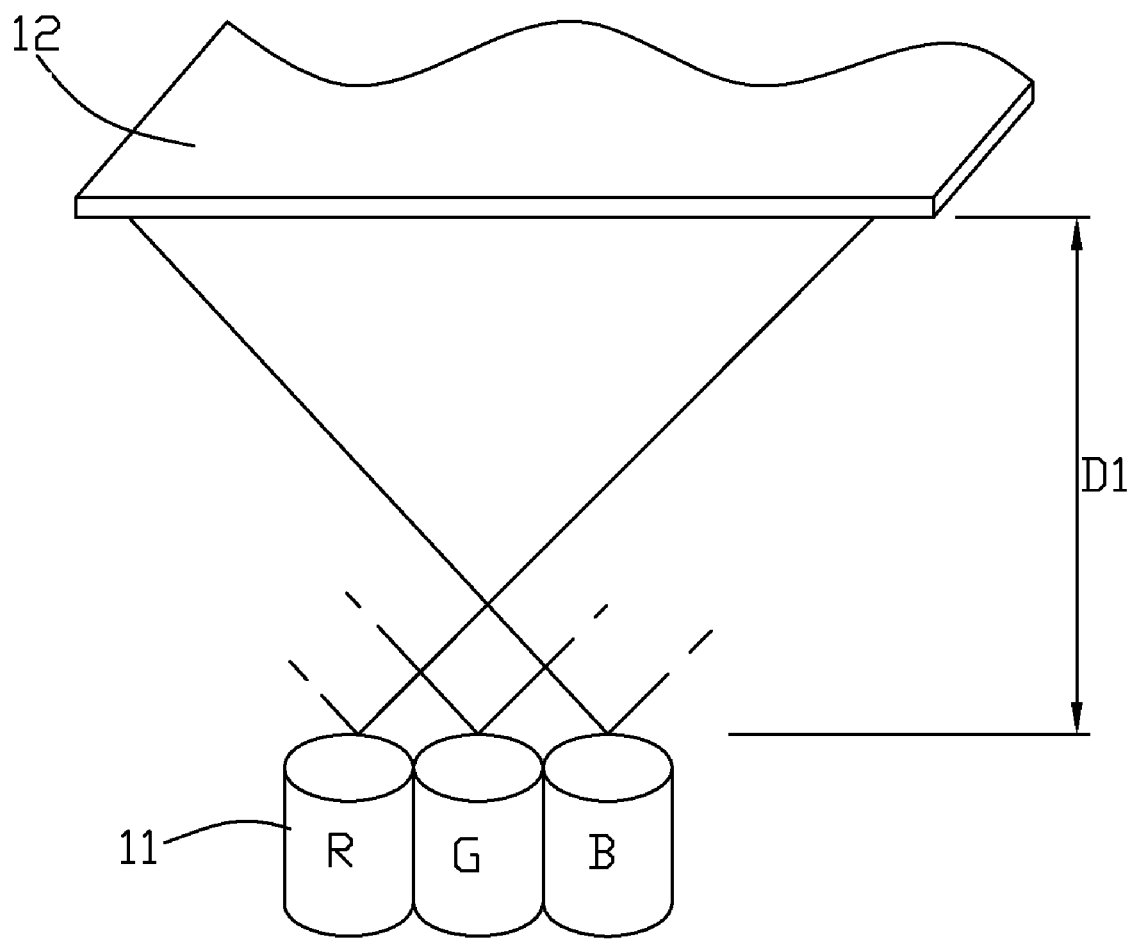
FIG. 1 is an isometric view of parts of a conventional bottom emitting LED.
Figure 2:
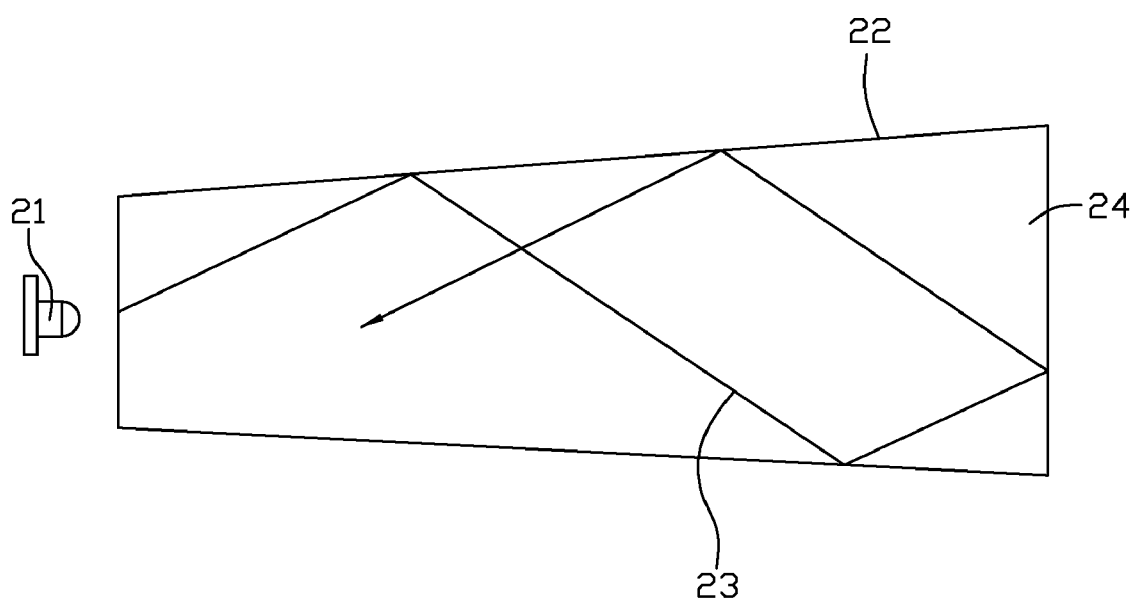
FIG. 2 is a side view of a conventional side emitting LED, showing an essential optical path thereof.
Figure 3:
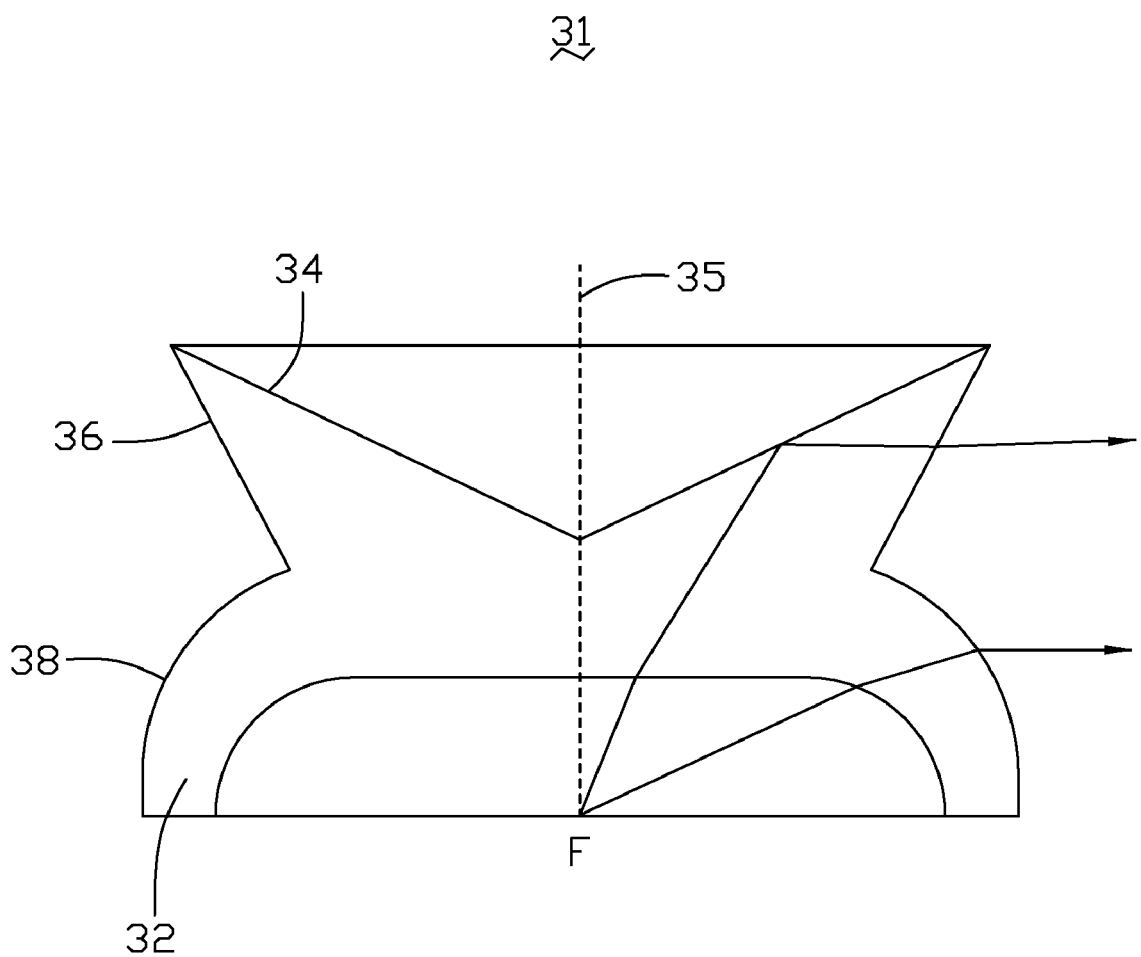
FIG. 3 is a cross-sectional view of an optical lens that is used in another kind of conventional bottom emitting LED.
Figure 4:
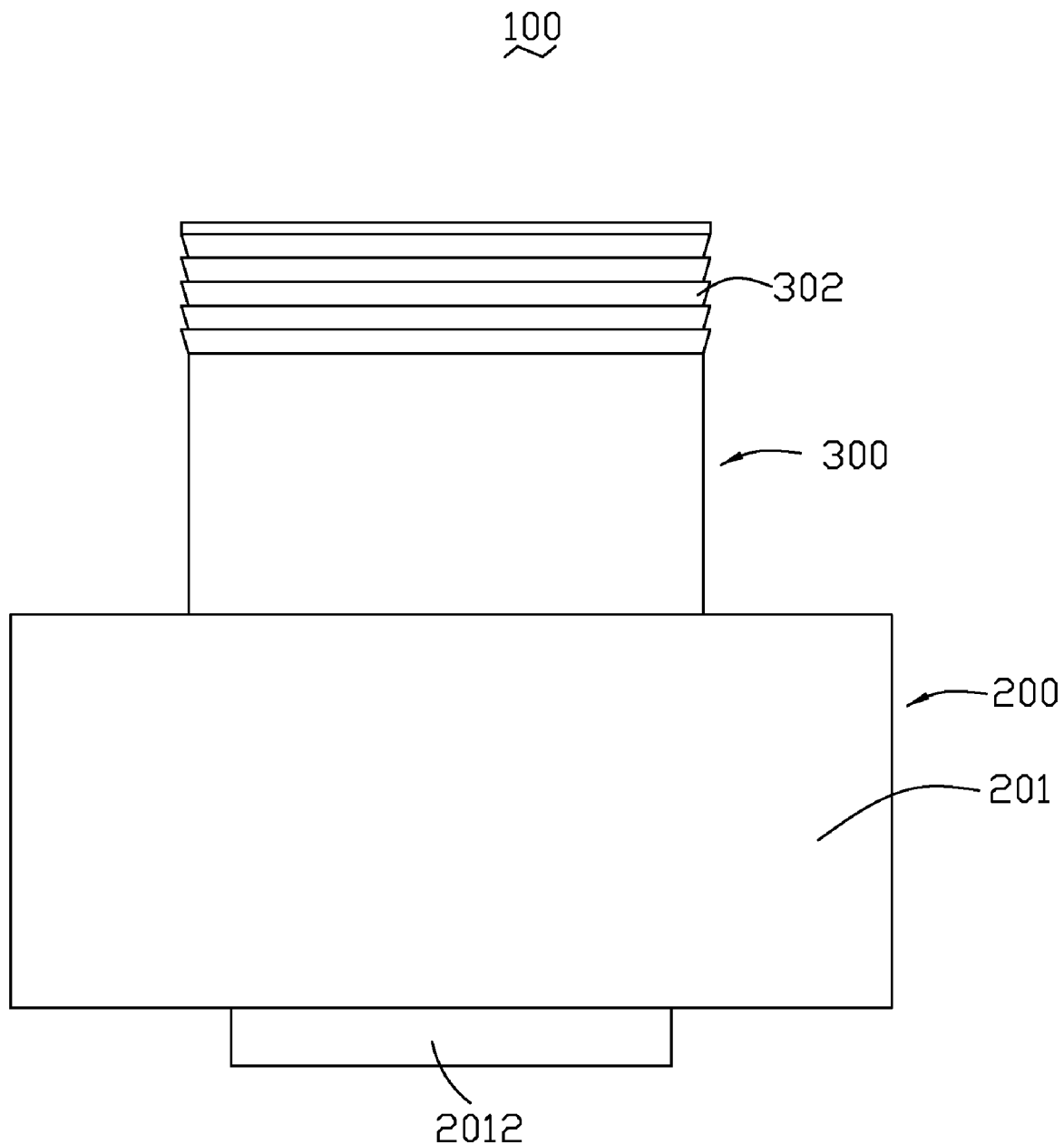
FIG. 4 is a plan view of a light emitting device in accordance with a first embodiment of the present invention.
Figure 5:
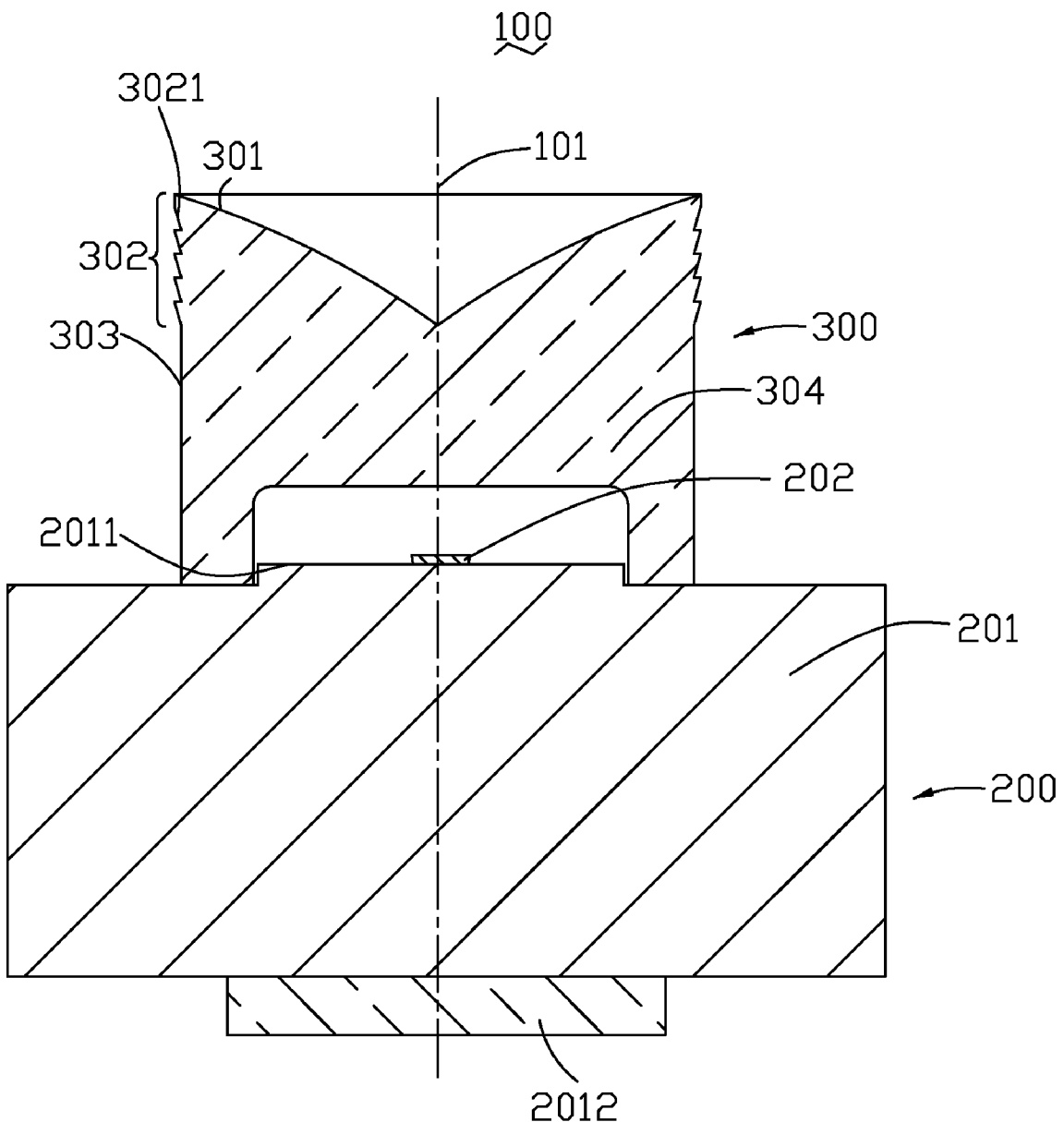
FIG. 5 is a cross-sectional view of the light emitting device shown in FIG. 4.

Referring to FIGS. 4-5, a light-emitting device 100 in accordance with a first embodiment is shown. The light-emitting device 100 includes a light-emitting semiconductor unit 200, and an optical lens 300 coupled to the light-emitting semiconductor unit 200. The light-emitting device 100 is a symmetrical body having a central axis 101 passing through centers of the light-emitting semiconductor unit 200 and the optical lens 300.

The light-emitting semiconductor unit 200 includes a package body 201, and a semiconductor chip 202 fixed on the package body 201. The package body 201 includes a protruding portion 2011 at a top end thereof, and a connecting portion 2012 at an opposite bottom end thereof. The semiconductor chip 202 is disposed on a middle of the protruding portion 2011. The connecting portion 2012 is configured for electrically connecting the semiconductor chip 202 to an external circuit (not shown). The semiconductor chip 202 has a light emitting PN (positive negative) junction, and is configured for emitting light. The semiconductor chip 202 may be of any of various shapes, including a cube, a rectangular block, a hemisphere, etc.

The optical lens 300 is symmetrical about the central axis 101. For example, the optical lens 300 can be cylindrically symmetrical about the central axis 101. The optical lens 300 includes a top surface 301, a base portion 304 opposite to the top surface 301, and a peripheral side surface (not labeled). The peripheral side surface has a corrugated refractive portion 302 and a smooth refractive portion 303 thereat. The base portion 304 has an inverted U-shaped cross-section taken along a plane passing through the central axis 101, and defines a cavity (not labeled) receiving the protruding portion 2011 therein. Thus, the semiconductor chip 202 disposed on the middle of the protruding portion 2011 is protected. In alternative embodiments, the optical lens 300 may be radially symmetrical about the central axis 101. That is, the optical lens 300 may be generally polyhedral, with the peripheral side surface thereof being generally polygonal.

The optical lens 300 is made of transparent material, such as (but not limited to) cyclic olefin copolymer (COC), polymethyl methacrylate (PMMA), polycarbonate (PC), PC/PMMA, silicone, fluorocarbon polymer, and polyetherimide (PEI). The optical lens 300 may be manufactured independently using any of various well-known techniques, such as diamond turning (i.e., the optical lens 300 is shaped by a lathe with a diamond bit), injection molding, and casting. Alternatively, the optical lens 300 may be integrally formed on the package body 201 having the semiconductor chip 202 by any of various techniques such as (but not limited to) injection molding (e.g., insert molding), and casting.

The top surface 301 is a substantially funnel-shaped (or cone-shaped) surface. In the case where the optical lens 300 is cylindrically symmetrical about the central axis 101, the top surface 301 has a same symmetrical double-arc-shaped cross-section for any cross-section taken along any plane passing through the central axis 101. The two arcs of the symmetrical double-arc shape are convex, with the top surface 301 being generally convex. That is, the top surface 301 has a uniform curvature through 360° measured around the central axis 101. Thereby, the top surface 301 has the characteristic of being a total internal reflection surface. This means the top surface 301 can effectively reflect light so that the light exits the optical lens 300 through the corrugated refractive portion 302. In the case where the optical lens 300 is radially symmetrical about the central axis 101, the top surface 301 may have a symmetrical double-arc-shaped cross-section for a cross-section taken along a plane passing through the central axis 101, and may have two or more different double-arc-shaped cross-sections taken along a plane passing through the central axis 101, depending on where the plane of the cross-section passes through the central axis 101 is located, and depending on the particular radially symmetrical configuration that the optical lens 300 has. That is, the top surface 301 includes a plurality of curved portions connected to each other. The curved portions cooperatively provide the top surface 301 with the characteristic of being a total internal reflection surface. Thereby, the top surface 301 can effectively reflect light so that the light exits the optical lens 300 through the corrugated refractive portion 302.

The corrugated refractive portion 302 includes a top end (not labeled) connecting to the top surface 301, and a bottom end (not labeled) connecting to the smooth refractive portion 303. The bottom end of the corrugated refractive portion 302 is configured to be lower than a bottommost extremity of the top surface 301. The corrugated refractive portion 302 includes a plurality of protruding ridge structures that encircle or surround the optical lens 300 thereat. In the illustrated embodiment, the ridge structures are parallel to each other. Each of the ridge structures has a triangular cross-section taken along a plane passing through the central axis 101. In the illustrated embodiment, the triangular cross-sections of the ridge structures have a same orientation. Each of the ridge structures includes a slanted refractive surface 3021. In the illustrated embodiment, the slanted refractive surfaces 3021 of the ridge structures are slanted at a same angle relative to the central axis 101. A desired light emitting angle of each ridge structure can be obtained by configuring the slant angle of the refractive surface 3021 accordingly. It should be understood that in alternative embodiments, the refractive surfaces 3021 may have different slant angles. Thus, the light distribution characteristics of the corrugated refractive portion 302 can be configured as needed.

In one embodiment, the smooth refractive portion 303 has a cylindrical surface. The smooth refractive portion 303 is configured for refracting light that is directly received from the semiconductor chip 202—that is, light that is not reflected by the top surface 301. The light refracted at the smooth refractive portion 303 then exits the optical lens 300.

Figure 6:
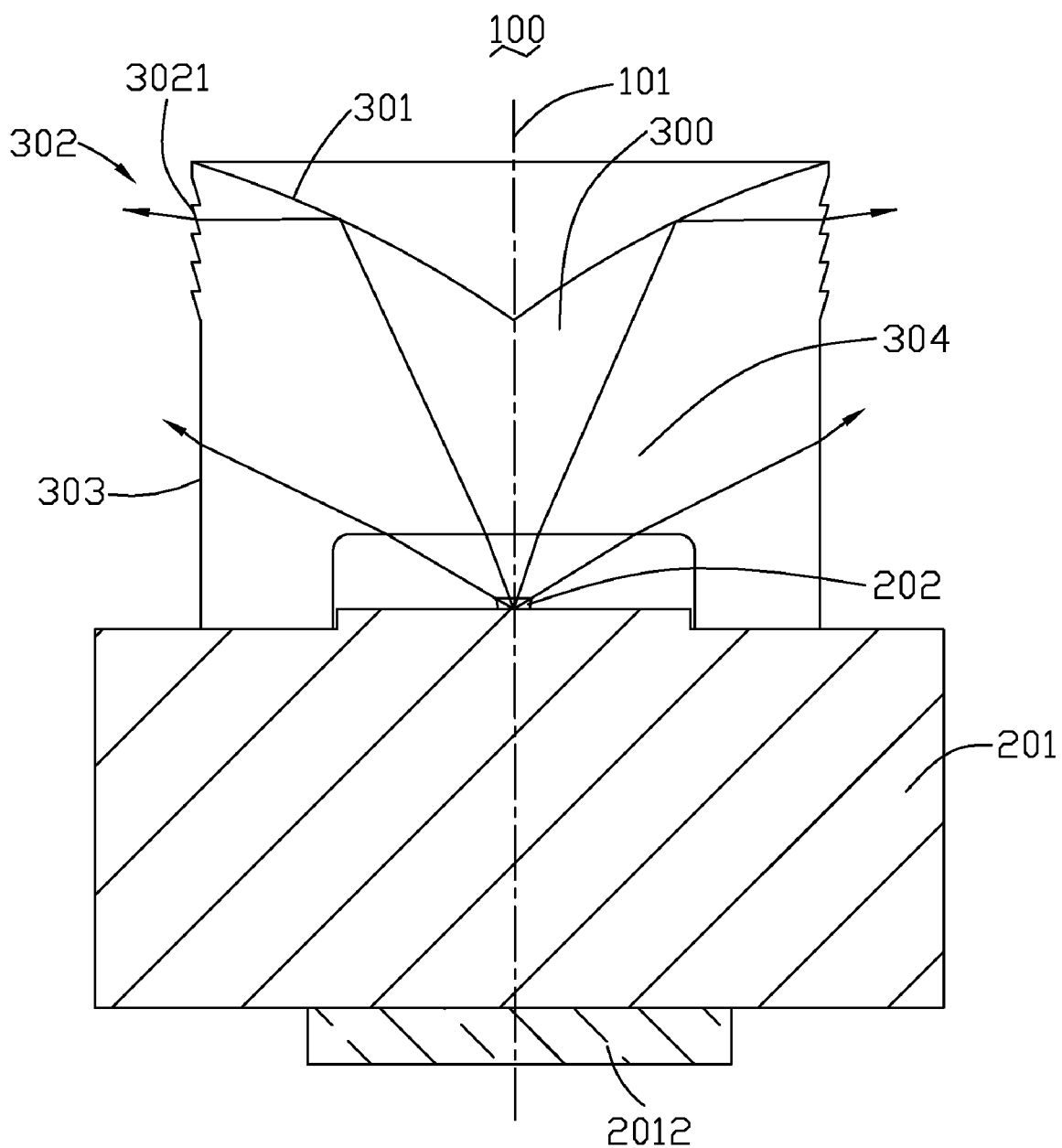
FIG. 6 is similar to FIG. 5, but showing essential optical paths of the light emitting device.

Referring to FIG. 6, in use, a majority of light emitting from the semiconductor chip 202 transmits upwardly to the top surface 301. The light is then totally reflected by the top surface 301, and exits the optical lens 300 through the corrugated refractive portion 302. A minority of the light emitting from the semiconductor chip 202 transmits directly to the smooth refractive portion 303. The light is then refracted by the smooth refractive portion 303 and exits the optical lens 300.

Figure 7:
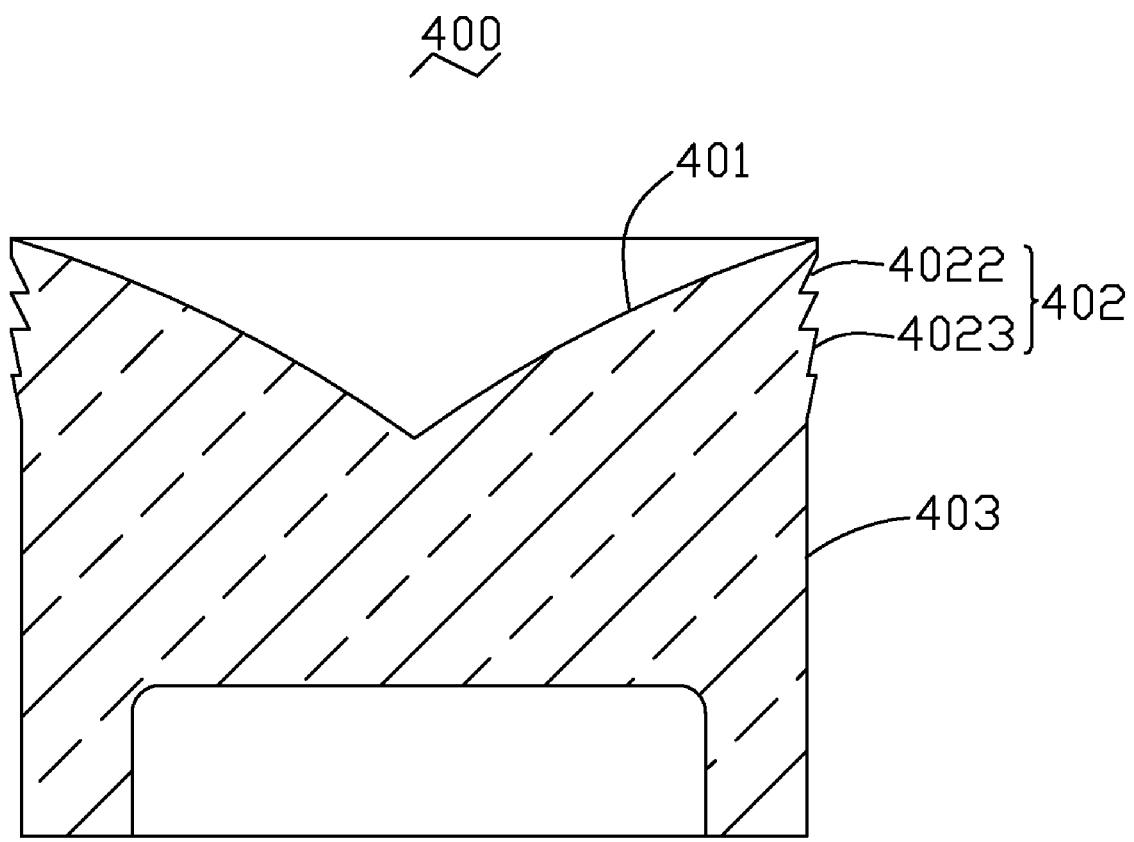
FIG. 7 is a cross-sectional view of an optical lens in accordance with a second embodiment of the present invention.

Referring to FIG. 7, an optical lens 400 in accordance with a second embodiment is similar to the optical lens 300 of the first embodiment. The optical lens 400 includes a top surface 401, a corrugated refractive portion 402, and a smooth refractive portion 403. A bottom end of the corrugated refractive portion 402 is configured to be higher than a bottommost extremity of the top surface 401. The corrugated refractive portion 402 includes a first refractive section 4022 and a second refractive section 4023. The first refractive section 4022 and the second refractive section 4023 each include a plurality of ridge structures. Each of the ridge structures has a triangular cross-section taken along a plane passing through a central axis of the optical lens 400. The first refractive section 4022 includes a plurality of first refractive surfaces (not labeled) having a same first slant angle relative to the central axis. The second refractive section 4023 includes a plurality of second refractive surfaces (not labeled) having a same second slant angle relative to the central axis. The first slant angle of the first refractive surfaces is different from the second slant angle of the second refractive surfaces. Desired light emitting angles of the first refractive section 4022 and the second refractive section 4023 can be obtained by configuring the respective slant angles accordingly. Thus, a desired light distribution characteristic of the corrugated refractive portion 402 can be achieved.

Figure 8:
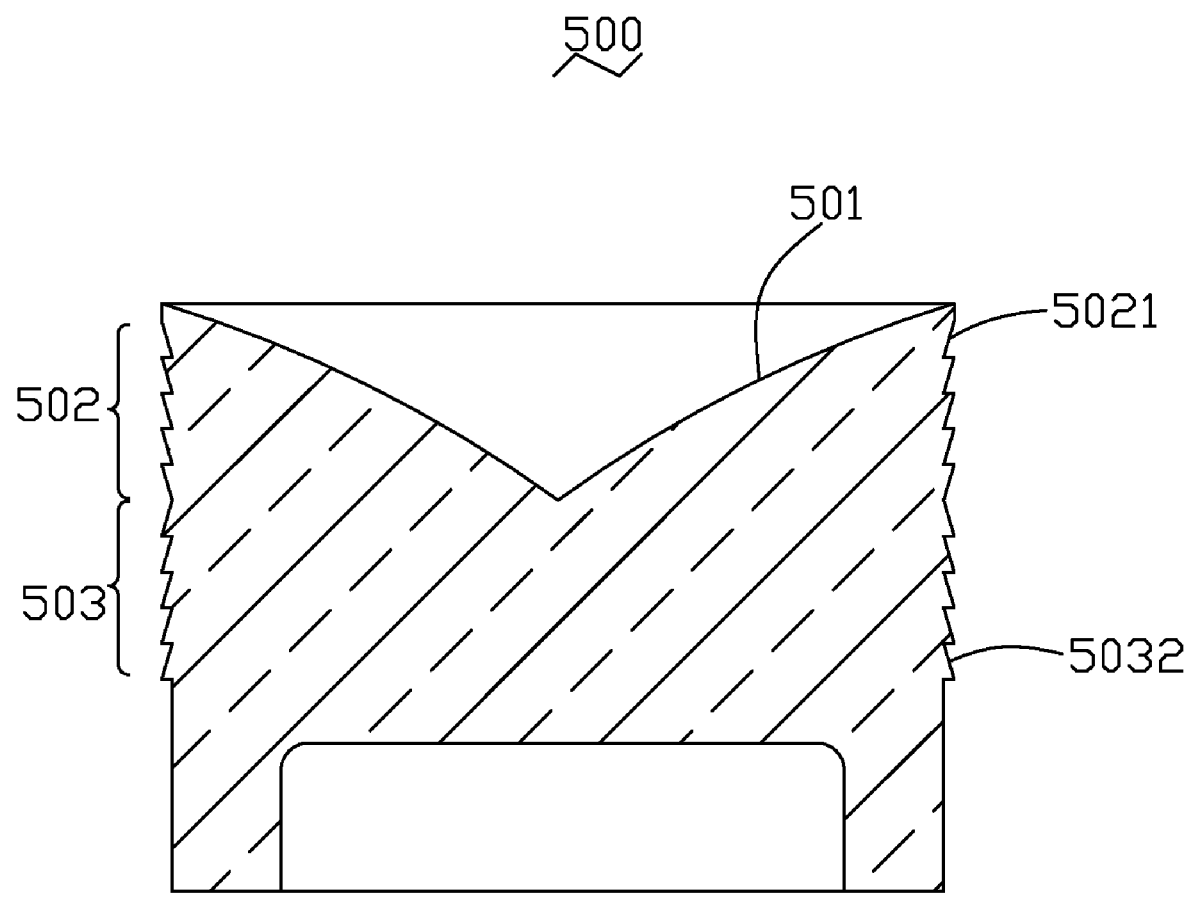
FIG. 8 is a cross-sectional view of an optical lens in accordance with a third embodiment of the present invention.

Referring to FIG. 8, an optical lens 500 in accordance with a third embodiment is similar to the optical lens 300 of the first embodiment. The optical lens 500 includes a top surface 501, a first corrugated refractive portion 502, a second corrugated refractive portion 503, and a cylindrical side surface (not labeled). A bottom end of the second corrugated refractive portion 503 is configured to be lower than a bottommost extremity of the top surface 501. The first corrugated refractive portion 502 includes a plurality of ridge structures, and each of the ridge structures includes a first refractive surface 5021. The second corrugated refractive portion 503 includes a plurality of ridge structures, and each of the ridge structures includes a second refractive surface 5032. The first refractive surfaces 5021 have a same first slant angle relative to a central axis of the optical lens 500. The second refractive surfaces 5032 have a same second slant angle relative to the central axis of the optical lens 500. In the illustrated embodiment, the first slant angle is equal to the second slant angle. However, the first refractive surfaces 5021 and the second refractive surfaces 5032 are oriented symmetrically relative to each other. The first corrugated refractive portion 502 is configured for refracting light that is received from a semiconductor chip (not shown) via the top surface 501, whereupon the refracted light exits the optical lens 500. The second corrugated refractive portion 503 is configured for refracting light that is directly received from the semiconductor chip, whereupon the refracted light exits the optical lens 500.

Figure 9:
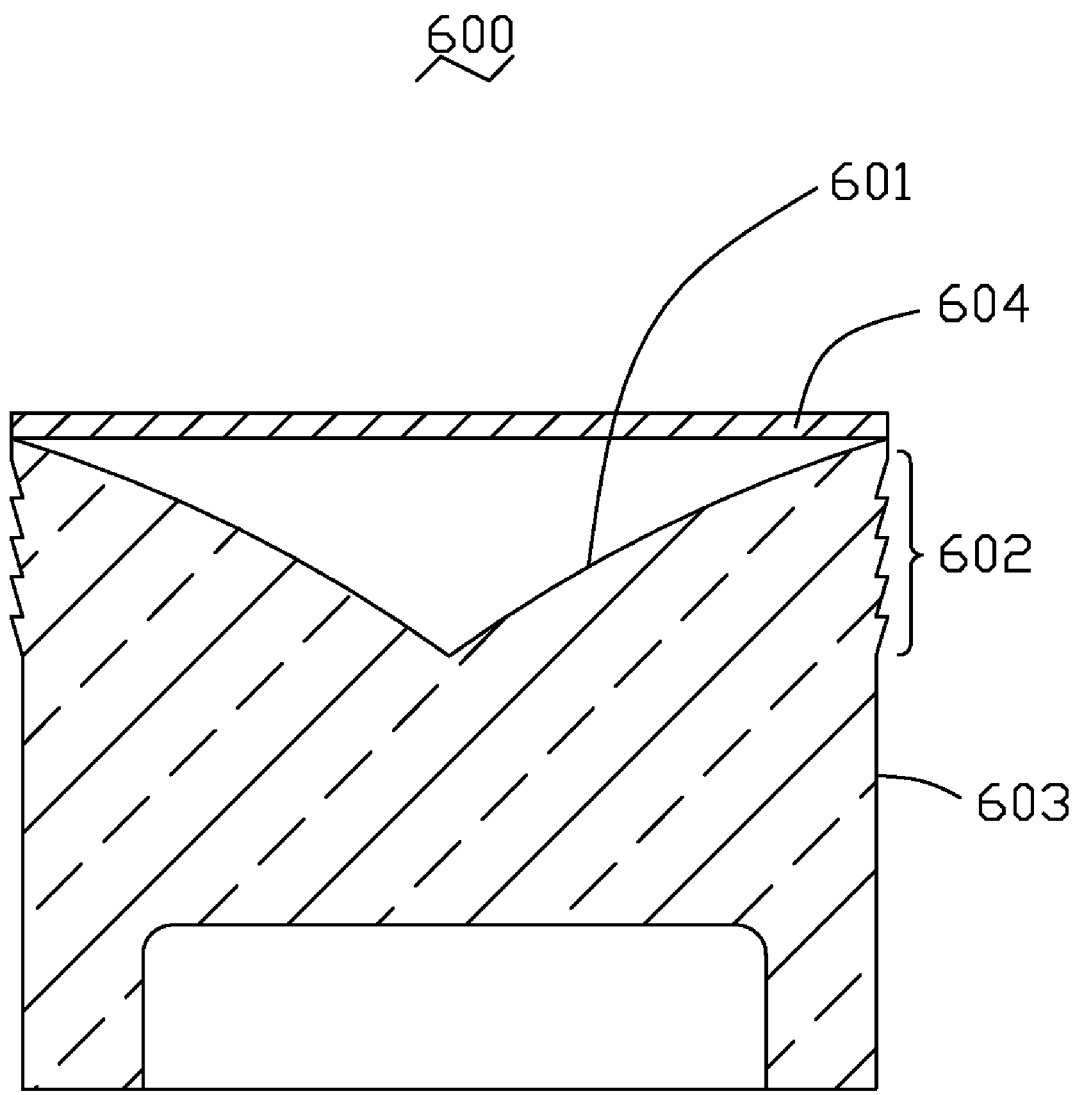
FIG. 9 is a cross-sectional view of an optical lens in accordance with a fourth embodiment of the present invention.

Referring to FIG. 9, an optical lens 600 in accordance with a fourth embodiment is similar to the optical lens 300 of the first embodiment. The optical lens 600 includes a top surface 601, a corrugated refractive portion 602, a smooth refractive portion 603, and a reflecting sheet 604. The reflecting sheet 604 is disposed above the top surface 601. The reflecting sheet 604 is configured for reflecting any light that escapes out of the top surface 601 back into the optical lens 600. Thereby, the efficiency of utilization of light provided by the optical lens 600 can be improved. In the illustrated embodiment, the reflecting sheet 604 is a reflecting plate.

Figure 10:
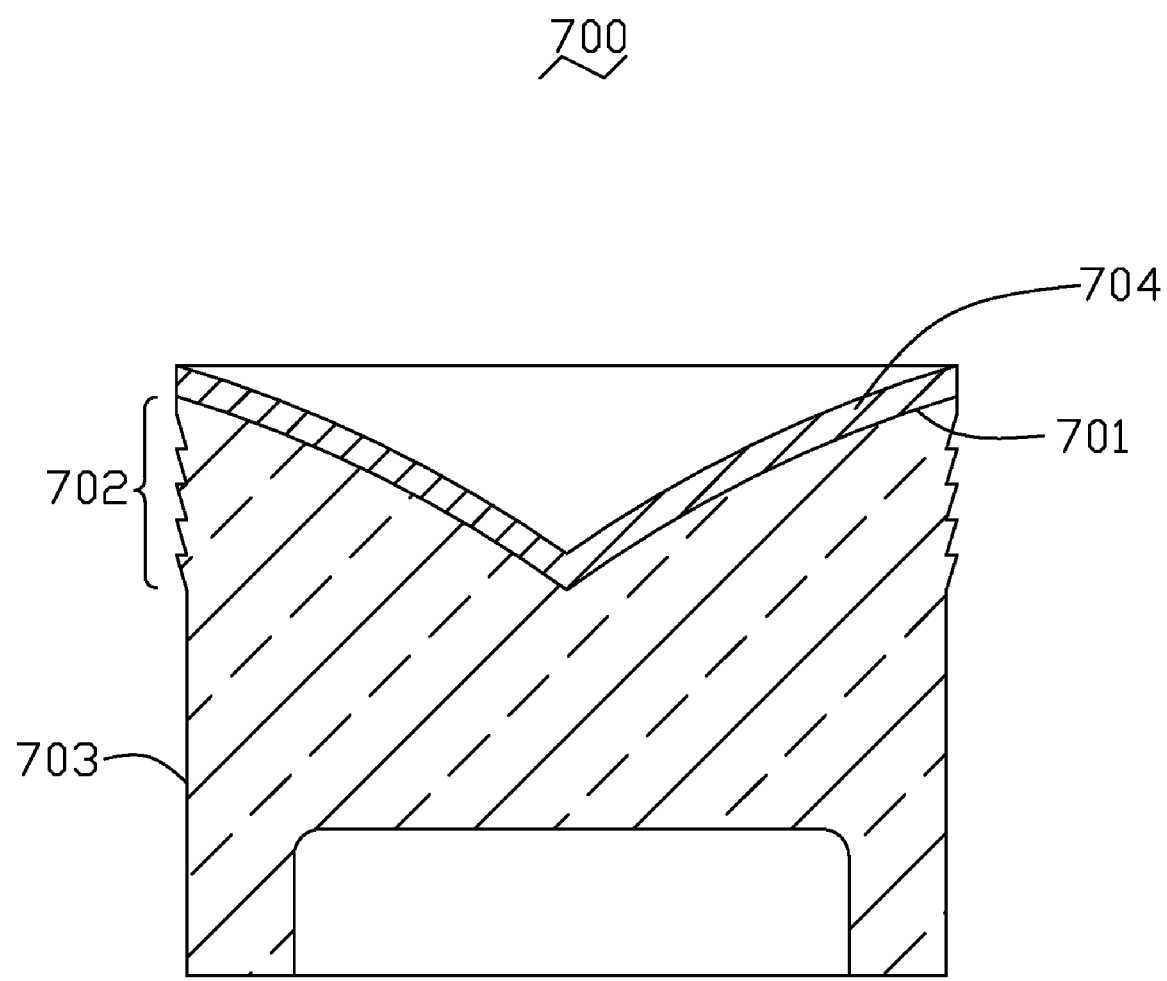
FIG. 10 is a cross-sectional view of an optical lens in accordance with a fifth embodiment of the present invention.

Referring to FIG. 10, an optical lens 700 in accordance with a fifth embodiment is similar to the optical lens 300 of the first embodiment. The optical lens 700 includes a top surface 701, a corrugated refractive portion 702, a smooth refractive portion 703, and a reflecting film 704. The reflecting film 704 is located on the top surface 701. The reflecting film 704 is configured for preventing any light from escaping out from the top surface 701. Thereby, the efficiency of utilization of light provided by the optical lens 700 can be improved, and the uniformity of light output from the optical lens 700 can be enhanced.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. An optical lens comprising:
 a generally funnel-shaped top surface;
 a base portion opposite to the top surface; and
 a peripheral side surface defining a first refractive portion, wherein the first refractive portion comprises a first refractive section and a second refractive section, the first refractive section and the second refractive section each comprises a plurality of ridge structures, each of the ridge structures has a triangular cross-section, the ridge structures of the first refractive section comprise a plurality of first refractive surfaces having a same first slant angle relative to a central axis of the optical lens, the ridge structures of the second refractive section comprise a plurality of second refractive surfaces having a same second slant angle relative to the central axis, and the first slant angle of the first refractive surfaces is different from the second slant angle of the second refractive surfaces.

2. The optical lens as claimed in claim 1, wherein the peripheral side surface further defines a second refractive portion, and the first refractive portion includes a top end adjacent to the top surface and a bottom end adjacent to the second refractive portion.

3. The optical lens as claimed in claim 2, wherein the second refractive portion is cylindrical.

4. The optical lens as claimed in claim 1, wherein the optical lens is made of transparent material selected from the group consisting of cyclic olefin copolymer, polymethyl methacrylate, polycarbonate, silicone, fluorocarbon polymer, and polyetherimide.

5. The optical lens as claimed in claim 1, wherein a cross-section of the generally funnel-shaped top surface taken along a plane passing through a central axis of the optical lens defines a symmetrical double-arc shape, and the two arcs of the symmetrical double-arc shape are convex, with the generally funnel-shaped top surface being generally convex.

* * * * *